United States Patent
Mikado et al.

(10) Patent No.: US 9,831,163 B2
(45) Date of Patent: Nov. 28, 2017

(54) CIRCUIT SUBSTRATE AND METHOD FOR MANUFACTURING THE SAME

(71) Applicant: IBIDEN CO., LTD., Ogaki (JP)

(72) Inventors: Yukinobu Mikado, Ogaki (JP); Mitsuhiro Tomikawa, Ogaki (JP); Koji Asano, Ogaki (JP); Kotaro Takagi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/052,314

(22) Filed: Feb. 24, 2016

(65) Prior Publication Data
US 2016/0268189 A1   Sep. 15, 2016

(30) Foreign Application Priority Data

Mar. 11, 2015   (JP) .................................. 2015-048440

(51) Int. Cl.
| | |
|---|---|
| *H05K 1/00* | (2006.01) |
| *H05K 1/02* | (2006.01) |
| *H01L 23/498* | (2006.01) |
| *H01L 23/367* | (2006.01) |
| *H01L 25/10* | (2006.01) |

(52) U.S. Cl.
CPC .... *H01L 23/49822* (2013.01); *H01L 23/3677* (2013.01); *H01L 25/105* (2013.01); *H01L 23/49816* (2013.01); *H01L 23/49827* (2013.01); *H01L 2224/16225* (2013.01); *H01L 2224/18* (2013.01); *H01L 2224/48091* (2013.01); *H01L 2224/48227* (2013.01); *H01L 2924/15311* (2013.01); *H01L 2924/181* (2013.01)

(58) Field of Classification Search
CPC ............... H01L 25/105; H01L 23/3677; H01L 25/49838; H01L 25/49827; H01L 25/49822; H01L 21/4882; H01L 21/4857; H01L 21/486; H05K 1/00; H05K 1/02; H05K 1/03; H05K 1/11; H05K 1/18; H05K 3/00; H05K 3/10; H05K 3/30; H05K 7/20
USPC ......... 174/252, 260, 262–267; 361/701, 704, 361/709, 720
See application file for complete search history.

(56) References Cited

U.S. PATENT DOCUMENTS

| | | | | |
|---|---|---|---|---|
| 2002/0034066 | A1* | 3/2002 | Huang ................ | H01L 23/3677 361/704 |
| 2007/0040255 | A1* | 2/2007 | Osone ................ | H01L 23/3677 257/678 |

(Continued)

FOREIGN PATENT DOCUMENTS

JP   2013-135168 A   7/2013

*Primary Examiner* — Hoa C Nguyen
(74) *Attorney, Agent, or Firm* — Oblon, McClelland, Maier & Neustadt, L.L.P.

(57) ABSTRACT

A circuit substrate includes a core substrate having a cavity, a metal block accommodated in the cavity of the core substrate, a first build-up layer including an insulating resin layer and laminated on a first surface of the core substrate such that the insulating resin layer is covering a first surface of the metal block in the cavity, and a second build-up layer including an insulating resin layer and laminated on a second surface of the core substrate such that the insulating resin layer is covering a second surface of the metal block in the cavity. The second build-up layer includes via conductors connected to the second surface of the metal block and common lands connecting the via conductors in parallel.

20 Claims, 19 Drawing Sheets

(56) References Cited

U.S. PATENT DOCUMENTS

| | | | | |
|---|---|---|---|---|
| 2009/0115050 A1* | 5/2009 | Kasuya | ............... | H01L 23/3677 |
| | | | | 257/701 |
| 2012/0261166 A1* | 10/2012 | Oh | ....................... | H05K 1/0206 |
| | | | | 174/252 |
| 2014/0048319 A1* | 2/2014 | Pan | ..................... | H05K 1/0216 |
| | | | | 174/258 |
| 2014/0355215 A1* | 12/2014 | Canete | ..................... | H05K 3/30 |
| | | | | 361/720 |

* cited by examiner

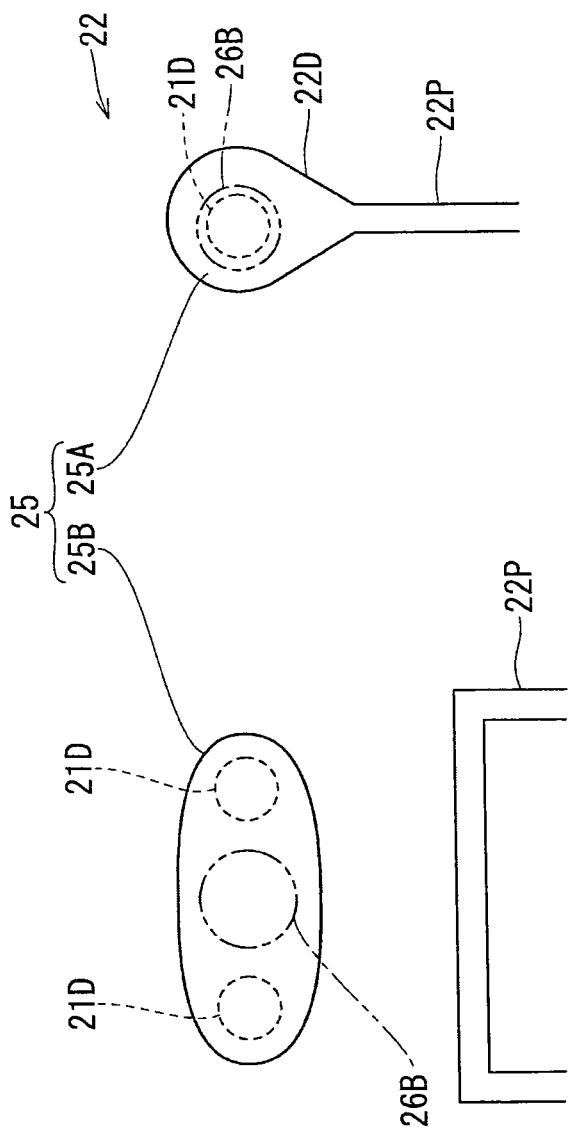

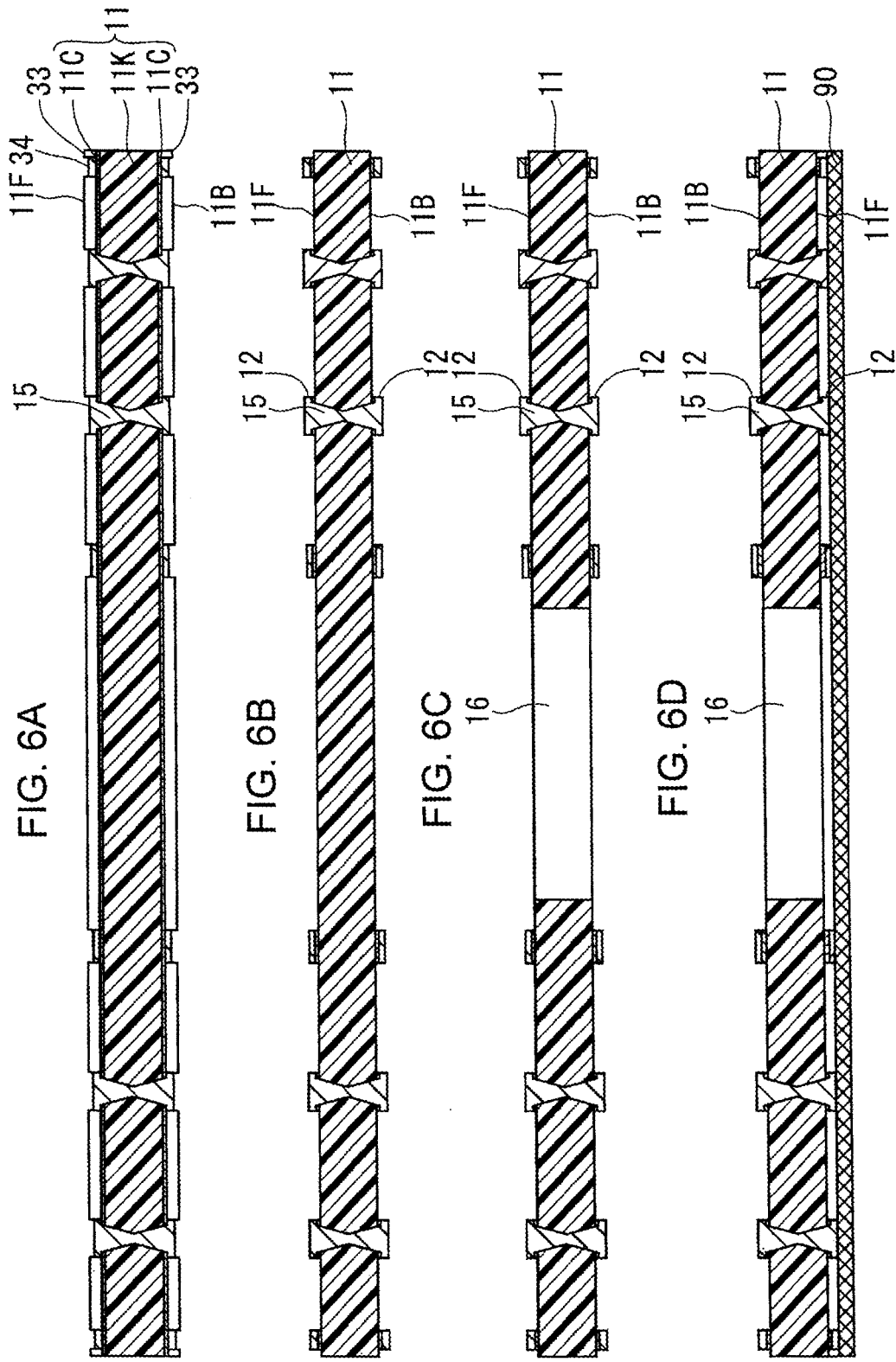

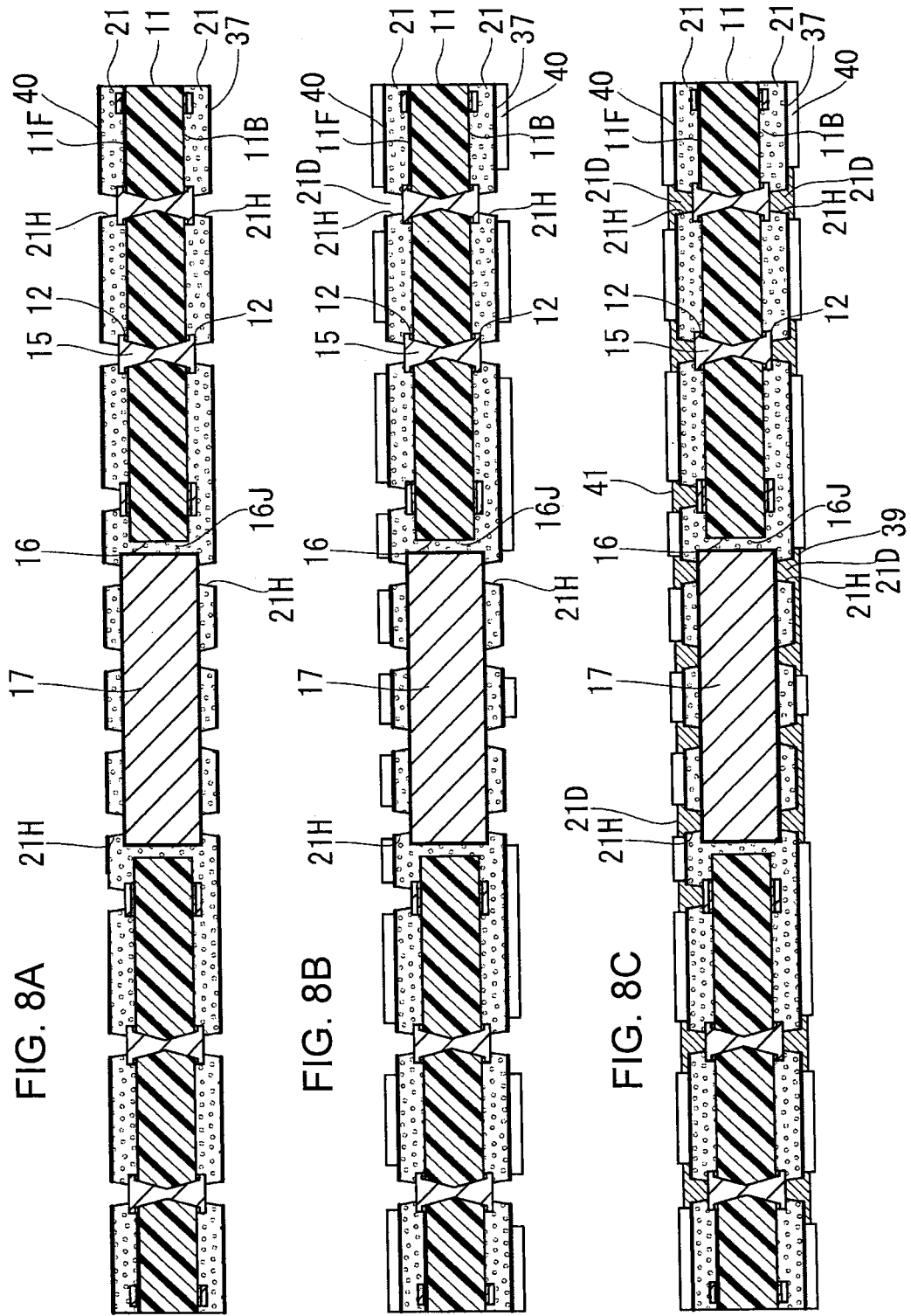

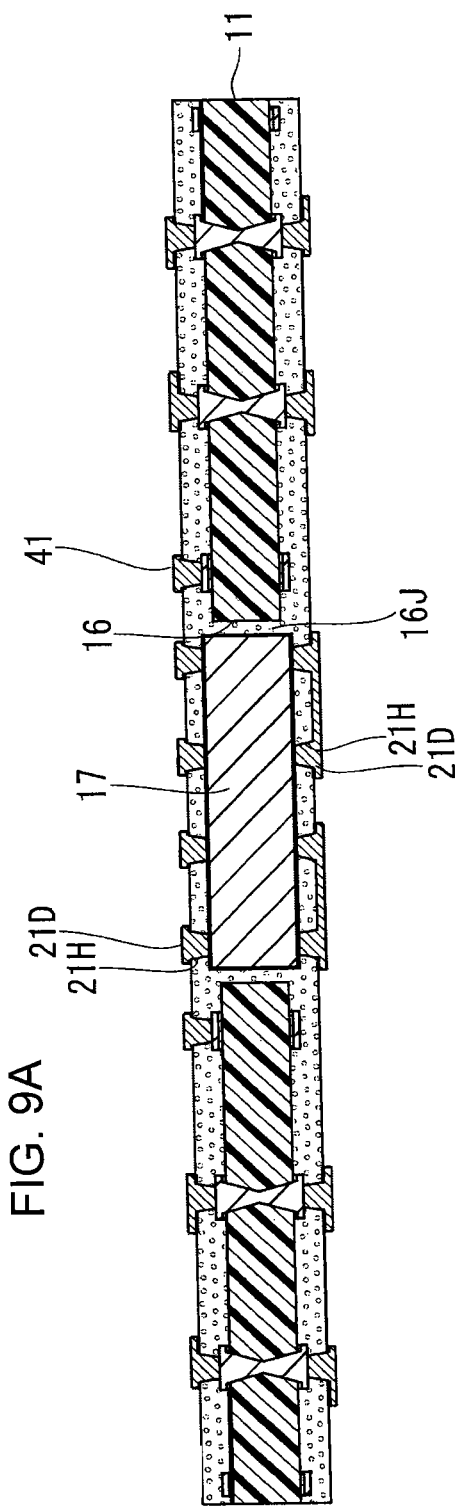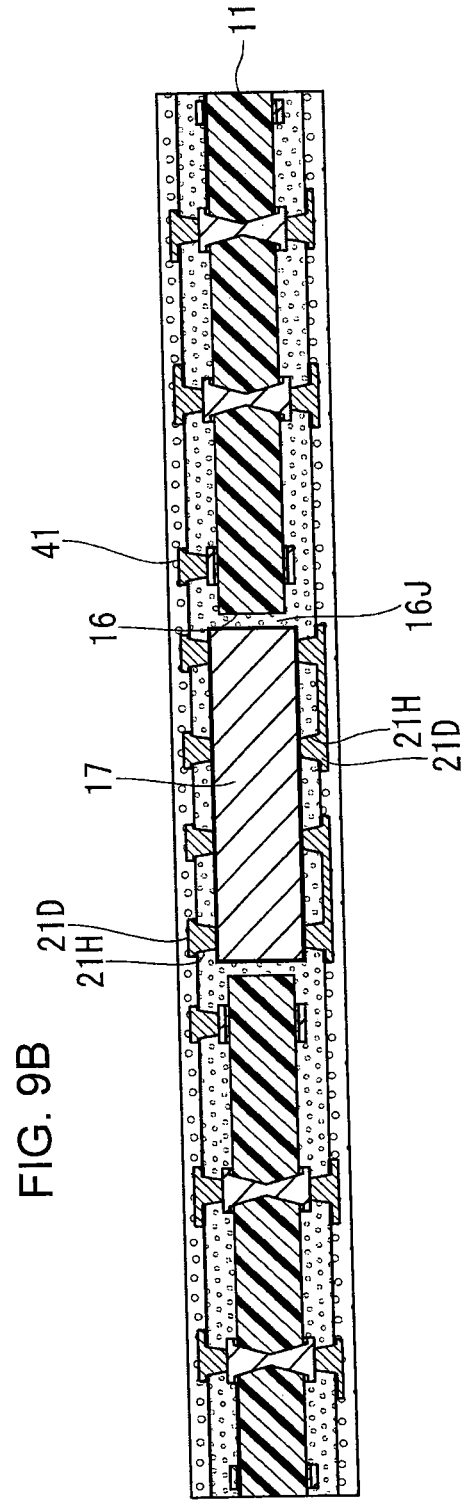

CIRCUIT SUBSTRATE AND METHOD FOR MANUFACTURING THE SAME

CROSS-REFERENCE TO RELATED APPLICATIONS

The present application is based upon and claims the benefit of priority to Japanese Patent Application No. 2015-048440, filed Mar. 11, 2015, the entire contents of which are incorporated herein by reference.

BACKGROUND OF THE INVENTION

Field of the Invention

The present invention relates to a circuit substrate in which a metal block is accommodated in a cavity of a core substrate, and relates to a method for manufacturing the circuit substrate.

Description of Background Art

Japanese Patent Laid-Open Publication No. 2013-135168 describes a circuit substrate in which a metal block is connected to a motherboard or an element via conductors. The entire contents of this publication are incorporated herein by reference.

SUMMARY OF THE INVENTION

According to one aspect of the present invention, a circuit substrate includes a core substrate having a cavity, a metal block accommodated in the cavity of the core substrate, a first build-up layer including an insulating resin layer and laminated on a first surface of the core substrate such that the insulating resin layer is covering a first surface of the metal block in the cavity, and a second build-up layer including an insulating resin layer and laminated on a second surface of the core substrate such that the insulating resin layer is covering a second surface of the metal block in the cavity. The second build-up layer includes via conductors connected to the second surface of the metal block and common lands connecting the via conductors in parallel.

According to another aspect of the present invention, a method for manufacturing a circuit substrate includes forming a cavity in a core substrate, accommodating a metal block in the cavity of the core substrate, forming on a first surface of the core substrate a first build-up layer including an insulating resin layer such that the insulating resin layer covers a first surface of the metal block in the cavity, and forming on a second surface of the core substrate a second build-up layer including an insulating resin layer such that the insulating resin layer covers a second surface of the metal block in the cavity. The forming of the second build-up layer includes forming via conductors connected to the second surface of the metal block and common lands connecting the via conductors in parallel.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 is a plan cross-sectional view of the circuit substrate;

FIG. 6A-6D are cross-sectional side views illustrating manufacturing processes of the circuit substrate;

FIG. 8A-8C are cross-sectional side views illustrating manufacturing processes of the circuit substrate;

FIGS. 9A and 9B are cross-sectional side views illustrating manufacturing processes of the circuit substrate;

DETAILED DESCRIPTION OF THE EMBODIMENTS

Figure 1:
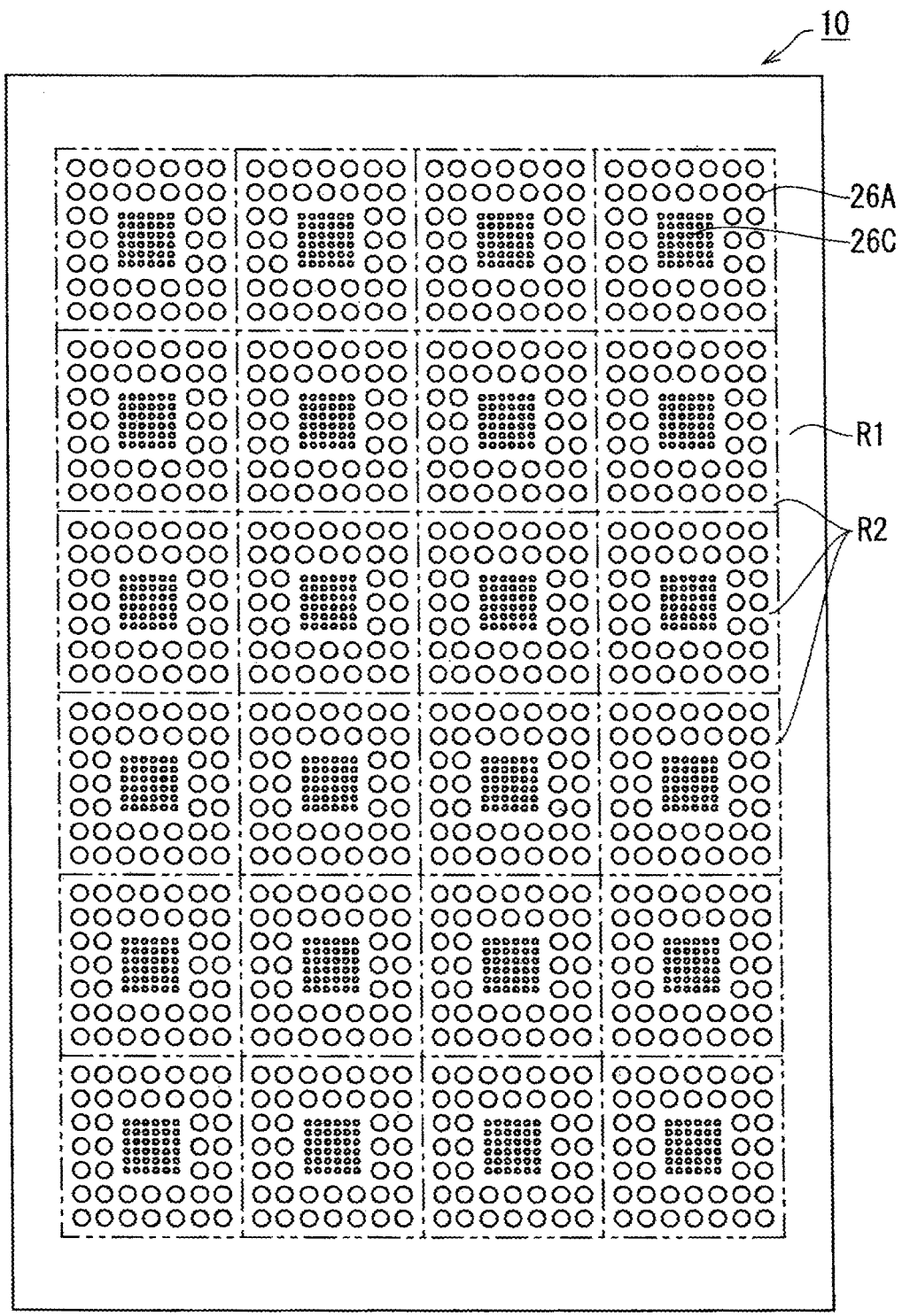
FIG. 1 is a plan view of a circuit substrate according to a first embodiment of the present invention.

The embodiments will now be described with reference to the accompanying drawings, wherein like reference numerals designate corresponding or identical elements throughout the various drawings.

First Embodiment

Figure 2:
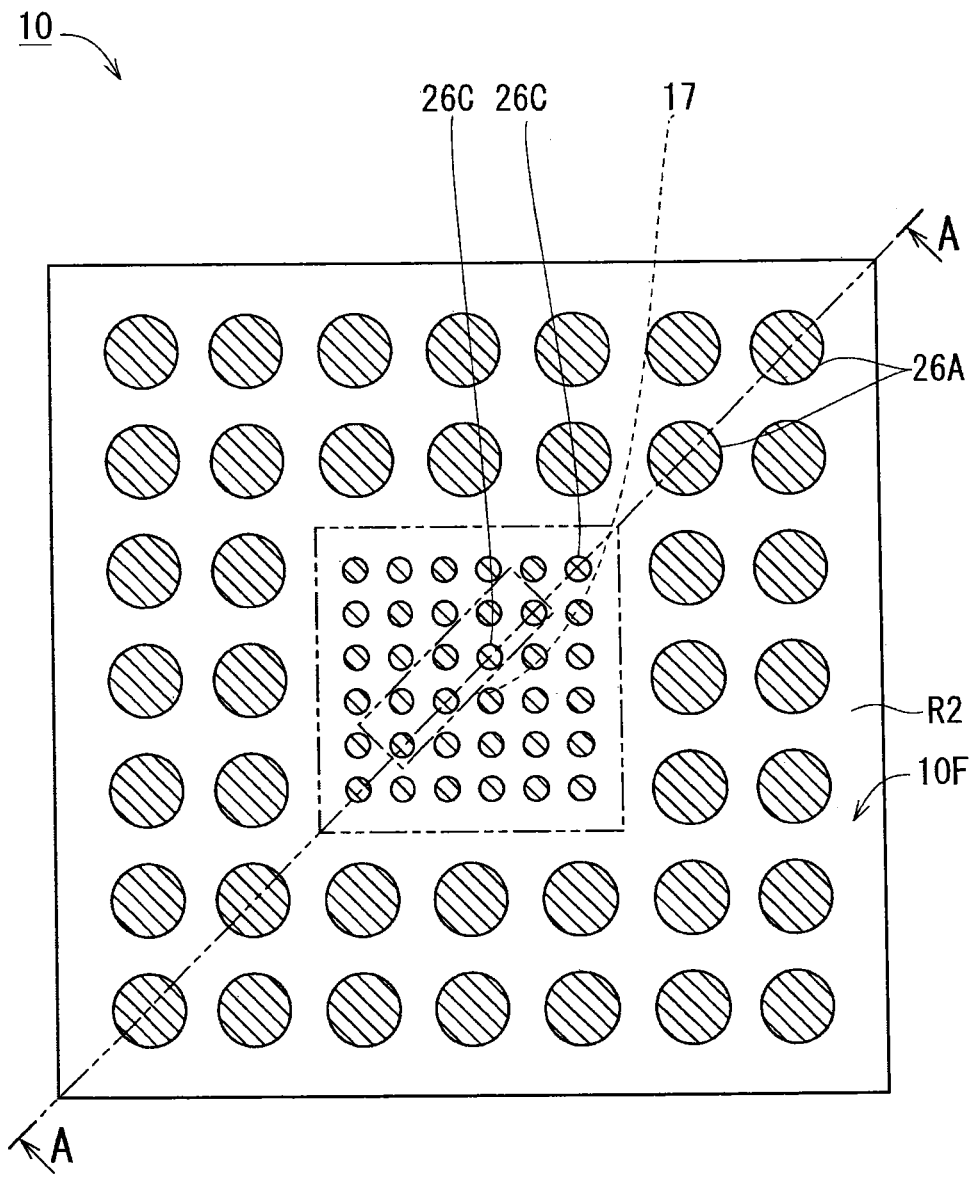
FIG. 2 is a plan view of a product region in the circuit substrate.
Figure 3:
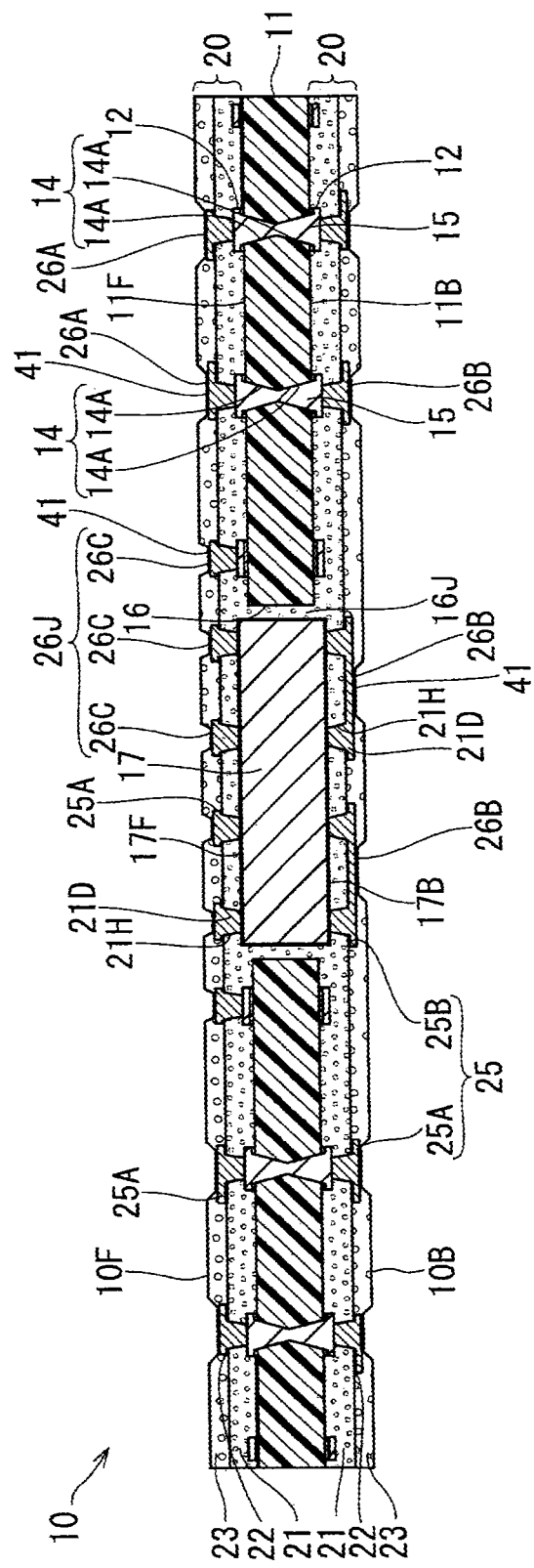
FIG. 3 is cross-sectional side view of the circuit substrate in an A-A cutting plane of FIG. 2.

In the following, a first embodiment of the present invention is described based on FIG. 1-11. As illustrated in a plan view of FIG. 1, a circuit substrate 10 of the present embodiment has, for example, a frame-shaped discard region (R1) along an outer edge, and an inner side of the discard region (R1) is divided into multiple square product regions (R2). FIG. 2 illustrates an enlarged view of one product region (R2). FIG. 3 illustrates an enlarged view of a cross-sectional structure of the circuit substrate 10, the cross section being taken by cutting the product region (R2) along a diagonal line.

As illustrated in FIG. 3, the circuit substrate 10 has structure that respectively has build-up layers (20, 20) on front and back surfaces of a core substrate 11. The core substrate 11 is formed of an insulating member. A conductor circuit layer 12 is formed on each of an F surface (11F), which is the front side surface of the core substrate 11, and a B surface (11B), which is the back side surface of the core substrate 11. Further, a cavity 16 and electrical conduction through holes 14 are formed in the core substrate 11.

The electrical conduction through holes 14 are each formed to have a middle-constricted shape in which small diameter side ends of tapered holes (14A, 14A) are communicatively connected, the tapered holes (14A, 14A) being respective formed by drilling from the F surface (11F) and the B surface (11B) of the core substrate 11 and being gradually reduced in diameter toward a deep side. On the other hand, the cavity 16 is formed in a shape that has a space in a shape of a rectangular cuboid.

The electrical conduction through holes 14 are filled with plating and multiple through-hole electrical conductors 15 are respectively formed. The conductor circuit layer 12 on the F surface (11F) and the conductor circuit layer 12 on the B surface (11B) are connected by the through-hole electrical conductors 15.

A metal block 17 is accommodated in the cavity 16. The metal block 17 is, for example, a copper cuboid. A planar shape of the metal block 17 is slightly smaller than a planar shape of the cavity 16. Further, a thickness of the metal block 17, that is, a distance between a first primary surface (17F) (which is one of front and back surfaces of the metal block 17) and a second primary surface (17B) (which is the other one of the front and back surfaces of the metal block 17), is slightly larger than a plate thickness of the core substrate 11. Then, the metal block 17 slightly protrudes from both the F surface (11F) and the B surface (11B) of the core substrate 11. The first primary surface (17F) of the metal block 17 is substantially flush with an outermost surface of the conductor circuit layer 12 on the F surface (11F) of the core substrate 11, and the second primary surface (17B) of the metal block 17 is substantially flush with an outermost surface of the conductor circuit layer 12 on the B surface (11B) of the core substrate 11. A gap between the metal block 17 and an inner surface of the cavity 16 is filled with a filling resin (16J).

The first primary surface (17F) and the second primary surface (17B) of the metal block 17 have substantially the same area and are parallel to each other. Further, the first primary surface (17F) and the second primary surface (17B) of the metal block 17 (that is, both the front and back surfaces of the metal block 17) are rough surfaces having an arithmetic average roughness (Ra) of 0.1 μm-3.0 μm (according to a definition of JIS B 0601-1994).

As illustrated in FIG. 3, both the build-up layer 20 on the F surface (11F) side of the core substrate 11 and the build-up layer 20 on the B surface (11B) side are formed by sequentially laminating, from the core substrate 11 side, an insulating resin layer 21 and a conductor layer 22. A solder resist layer 23 is laminated on the conductor layer 22. Further, via holes (21H) are formed in the insulating resin layer 21. The via holes (21H) are formed in a tapered shape that is gradually reduced in diameter toward the core substrate 11 side. Further, the via holes (21H) are filled with plating and multiple via conductors (21D) are formed. Then, the conductor circuit layer 12 and the conductor layer 22, and, the metal block 17 and the conductor layer 22, are connected by the via conductors (21D). Further, the metal block 17 is connected via four via conductors (21D) to the conductor layers (22, 22) on both the first primary surface (17F) side and the second primary surface (17B) side.

A land 25 is formed at a portion of the conductor layer 22, the portion connecting to a via conductor (21D). A "land" refers to a pattern of the conductor layer 22 that is formed on the insulating resin layer 21, the pattern being connected to a via conductor (21D) that is formed in the insulating resin layer 21.

As illustrated in FIG. 4, the land 25 is formed at a front end or a middle position (not illustrated in the drawings) of a wiring pattern (22P), or is formed at a position spaced apart from the wiring pattern (22P). Here, in the circuit substrate 10 of the present embodiment, as lands 25, an individual land (25A) and a common land (25B) are formed, only one via conductor (21D) being connected to a surface of the individual land (25A) on the core substrate 11 side, the common land (25B) being larger than the individual land (25A) and multiple via conductors (21D) being connected in parallel to a surface of the common land (25B) on the core substrate 11 side. Specifically, as illustrated in FIG. 3, among the four via conductors (21D) that are connected to the second primary surface (17B) of the metal block 17, two via conductors (21D, 21D) on a fight-hand side in FIG. 3 and two via conductors (21D, 21D) on a left-hand side are respectively connected in parallel to common lands (25B, 25B). The common land (25B) is formed in an oval shape of a size that allows base end portions of two via conductors (21D, 21D) that are connected to the common land (25B) to be accommodated therein (see FIG. 4). The other via conductors (21D) are each connected to an individual land (25A). The individual land (25A) is formed in a circular shape having a diameter slightly larger than that of the base end portion of the via conductor (21D). That is, the first primary surface (17F) of the metal block 17 is connected to four individual lands (25A) via four via conductors (21D), whereas the second primary surface (17B) of the metal block 17 are connected to two common lands (25B) via four via conductors (21D).

In FIG. 4, the solder resist layer 23 lateral to the wiring pattern (22P) and the land 25 is omitted. Further, a teardrop (22D) is formed in a connecting portion between the land 25 and the wiring pattern (22P) that extends from the land 25, so that an outer edge does not form an acute angle. Further, a diameter (top diameter) of a via conductor (21D) that connects the conductor circuit layer 12 and the conductor layer 22 and a diameter (top diameter) of a via conductor (21D) that connects the metal block 17 and the conductor layer 22 may be substantially the same or may be different.

As illustrated in FIG. 3, pad holes are formed in the solder resist layer 23, and a portion of the second conductor layer 22 that is positioned in a pad hole becomes a pad 26. A "pad" refers to a portion of a conductor layer for interlayer connection or a portion of a conductor layer for surface mounting. On an F surface (10F) of the circuit substrate 10 (the F surface (10F) being an outermost surface of the build-up layer 20 on the F surface (11F) of the core substrate 11), pads 26 include a group of medium pads (26A) that are formed in two rows along an outer edge of the product region (R2) and a group of small pads (26C) that are formed in vertical and horizontal rows in an inner side region surrounded by the group of the medium pads (26A). Further, an electronic component mounting part (26J) according to an embodiment of the present invention is formed from the group of the small pads (26C). Further, for example, as illustrated in FIG. 2, the metal block 17 is positioned at a position directly below a total of seven small pads (26C) including four small pads (26C) that are aligned on a diagonal line of the product region (R2) at a center of the group of the small pads (26C) and three small pads (26C) that are aligned parallel to the diagonal line next to the array of the four small pads (26C). Four of the seven small pads (26C) are respectively formed on four individual lands (25A) that are connected to the metal block 17. That is, the metal block 17 is connected via four via conductors (21D) to four small pads (26C) on the F surface (11F) side of the core substrate 11.

In contrast, on a B surface (10B) of the circuit substrate 10 (the B surface (10B) being an outermost surface of the build-up layer 20 on the B surface (11B) of the core substrate 11), two large pads (26B) that are larger than the medium pads (26A) and are respectively provided on the common lands (25B, 25B) form a substrate connecting part according to an embodiment of the present invention, and are connected via four via conductors (21D) to the metal block 17. That is, in the circuit substrate 10 of the present embodiment, the number of the pads 26 on the B surface (11B) side of the core substrate 11 that are connected to the metal block 17 is smaller than the number of the pads 26 on the F surface (11F) side of the core substrate 11 that are connected to the metal block 17. However, the number of the via conductors (21D) in the build-up layer 20 on the B surface (11B) side of the core substrate 11 that are connected to the metal block 17 and the number of the via conductors (21D) in the build-up layer 20 on the F surface (11F) side of the core substrate 11 that are connected to the metal block 17 are equal to each other. Further, in the present embodiment, a large pad (26B) on a common land (25B) is formed at a middle position between the two via conductors (21D) that are connected to the common land (25B).

The circuit substrate 10 of the present embodiment is manufactured as follows.

Figures 5A, 5B, 5C, 5D:
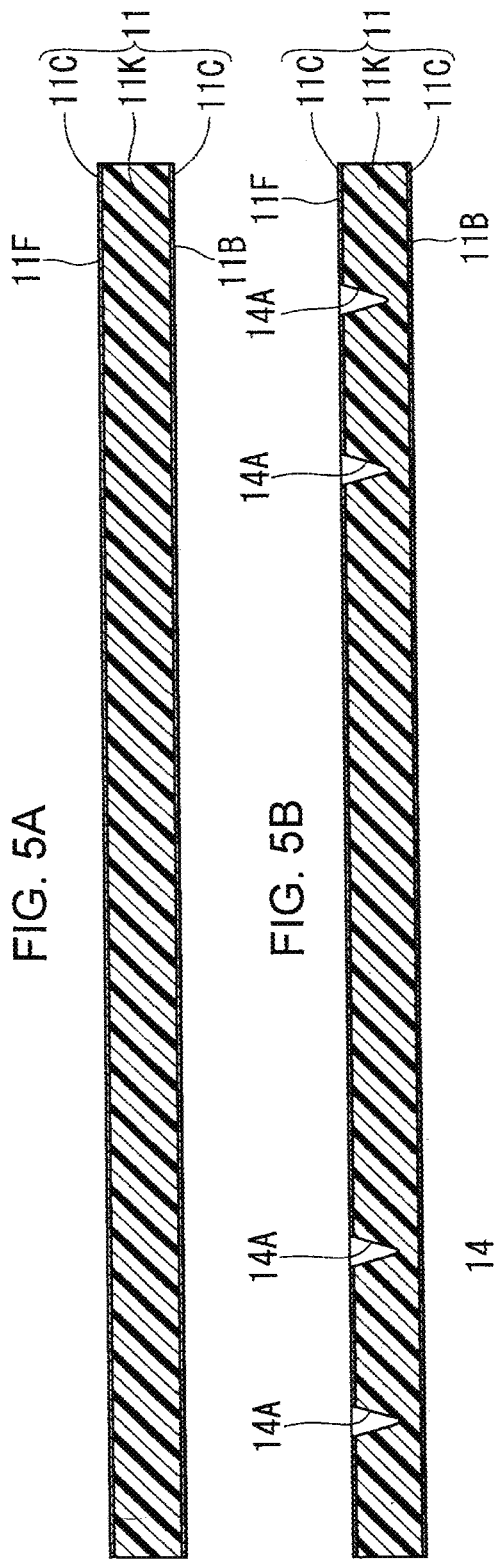
FIG. 5A-5D are cross-sectional side views illustrating manufacturing processes of the circuit substrate.

(1) As illustrated in FIG. 5A, a substrate as the core substrate 11 is prepared that is obtained by laminating a copper foil (11C) on both front and back surfaces of an insulating base material (11K) that is formed of an epoxy resin or a BT (bismaleimide triazine) resin and a reinforcing material such as a glass cloth.

(2) As illustrated in FIG. 5B, the tapered holes (14A) for forming the electrical conduction through holes 14 (see FIG. 3) are drilled by irradiating, for example, CO2 laser to the core substrate 11 from the F surface (11F) side.

(3) As illustrated in FIG. 5C, the tapered holes (14A) are drilled on the B surface (11B) side of the core substrate 11 by irradiating CO2 laser to positions directly on the back of the above-described tapered holes (14A) on the F surface (11F) side. The electrical conduction through holes 14 are formed from the tapered holes (14A, 14A).

(4) An electroless plating treatment is performed. An electroless plating film (not illustrated in the drawings) is formed on the copper foil (11C) and on inner surfaces of the electrical conduction through holes 14.

(5) As illustrated in FIG. 5D, a plating resist 33 of a predetermined pattern is formed on the electroless plating film on the copper foil (11C).

(6) An electrolytic plating treatment is performed. As illustrated in FIG. 6A, the electrical conduction through holes 14 are filled with electrolytic plating and the through-hole electrical conductors 15 are formed; and an electrolytic plating film 34 is formed on a portion of the electroless plating film (not illustrated in the drawings) on the copper foil (11C), the portion being exposed from the plating resist 33.

(7) The plating resist 33 is peeled off, and the electroless plating film (not illustrated in the drawings) and the copper foil (11C), which are below the plating resist 33, are removed. As illustrated in FIG. 6B, by the remaining electrolytic plating film 34, electroless plating film and copper foil (11C), the conductor circuit layer 12 is formed on the F surface (11F) of the core substrate 11, and the conductor circuit layer 12 is formed on the B surface (11B) of the core substrate 11. Then, the conductor circuit layer 12 on the F surface (11F) and the conductor circuit layer 12 on the B surface (11B) are in a state of being connected by the through-hole electrical conductors 15.

(8) As illustrated in FIG. 6C, the cavity 16 is formed in the core substrate 11 using a router or CO2 laser.

(9) As illustrated in FIG. 6D, a tape 90 made of a PET film is affixed to the F surface (11F) of the core substrate 11 so as to close the cavity 16.

(10) The metal block 17 is prepared. The metal block 17 is formed by cutting a copper plate or a copper block after the copper plate or the copper block is roughened by being immersed for a predetermined period of time in an acid solution (for example, an acid of which main components are sulfuric acid and hydrogen peroxide).

Figures 7A, 7B, 7C, 7D:
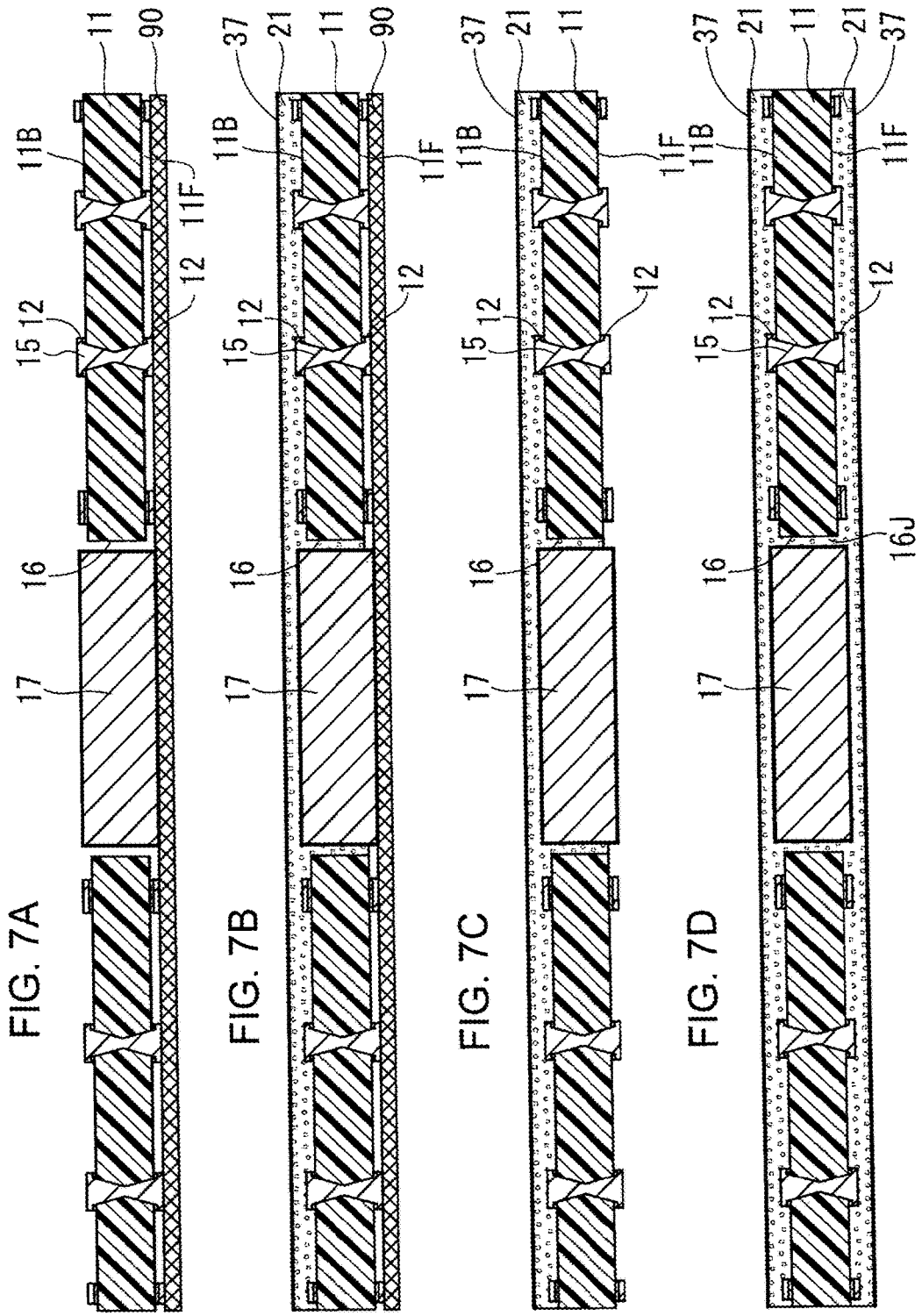
FIG. 7A-7D are cross-sectional side views illustrating manufacturing processes of the circuit substrate.

(11) As illustrated in FIG. 7A, the metal block 17 is accommodated in the cavity 16 using a mounter (not illustrated in the drawings).

(12) As illustrated in FIG. 7B, a prepreg (a resin sheet of a B-stage formed by impregnating a core material with resin) as the insulating resin layer 21 and a copper foil 37 are laminated on the conductor circuit layer 12 on the B surface (11B) of the core substrate 11, and then, the resulting substrate is hot-pressed. In doing so, spacing between conductor circuit layers (12, 12) on the B surface (11B) of the core substrate 11 is filled with the prepreg, and a gap between an inner surface of the cavity 16 and the metal block 17 is filled with thermosetting resin exuded from the prepreg.

(13) As illustrated in FIG. 7C, the tape 90 is removed.

(14) As illustrated in FIG. 7D, a prepreg as the insulating resin layer 21 and a copper foil 37 are laminated on the conductor circuit layer 12 on the F surface (11F) of the core substrate 11, and then, the resulting substrate is hot-pressed. In doing so, spacing between conductor circuit layers (12, 12) on the F surface (11F) of the core substrate 11 is filled with the prepreg, and a gap between an inner surface of the cavity 16 and the metal block 17 is filled with thermosetting resin exuded from the prepreg. Further, the above-described filling resin (16J) is formed by the thermosetting resin that exudes from the prepregs on the F surface (11F) and the B surface (11B) of the core substrate 11 and is filled in the gap between the inner surface of the cavity 16 and the metal block 17.

Instead of the prepreg, it is also possible to use a resin film that does not contain a core material as the insulating resin layer 21. In this case, without laminating a copper foil, a conductor circuit layer can be directly formed on a surface of the resin film using a semi-additive method.

(15) As illustrated in FIG. 8A, the via holes (21H) are formed by irradiating CO2 laser to the insulating resin layers (21, 21) that are respectively formed on the front and back sides of the core substrate 11 by the prepregs. Some of the via holes (21H) are formed on the conductor circuit layers 12 and some other via holes (21H) are formed on the metal block 17. When the via holes (21H) are formed on the metal block 17, unevenness of the rough surface of the metal block 17 positioned on a deep side of the via holes (21H) may be eliminated by laser irradiation or by desmear after laser irradiation.

(16) An electroless plating treatment is performed. Electroless plating films (not illustrated in the drawings) are formed on the insulating resin layers (21, 21) and in the via holes (21H, 21H).

(17) As illustrated in FIG. 8B, plating resists 40 of predetermined patterns are respectively formed on the electroless plating films on the copper foils 37.

(18) An electrolytic plating treatment is performed. As illustrated in FIG. 8C, the via holes (21H, 21H) are filled with plating and the via conductors (21D, 21D) are formed. Further, electrolytic plating films (39, 39) are formed on portions of the electroless plating films (not illustrated in the drawings) on the insulating resin layers (21, 21), the portions being exposed from the plating resists 40.

(19) The plating resists 40 are removed, and the electroless plating films (not illustrated in the drawings) and the copper foils 37, which are below the plating resists 40, are removed. As illustrated in FIG. 9A, the conductor layers 22 are respectively formed on the insulating resin layers 21 on the front and back sides of the core substrate 11 by the remaining electrolytic plating films 39, electroless plating films and copper foils 37. Then, a state is achieved in which, on each of the front and back sides of the core substrate 11, a portion of the conductor layer 22 and the conductor circuit layer 12 are connected by the via conductors (21D), and the other portion of the conductor layer 22 and the metal block 17 are connected by the via conductors (21D).

(20) As illustrated in FIG. 9B, the solder resist layers (23, 23) are respectively laminated on the conductor layers 22 on the front and back sides of the core substrate 11.

Figure 10:
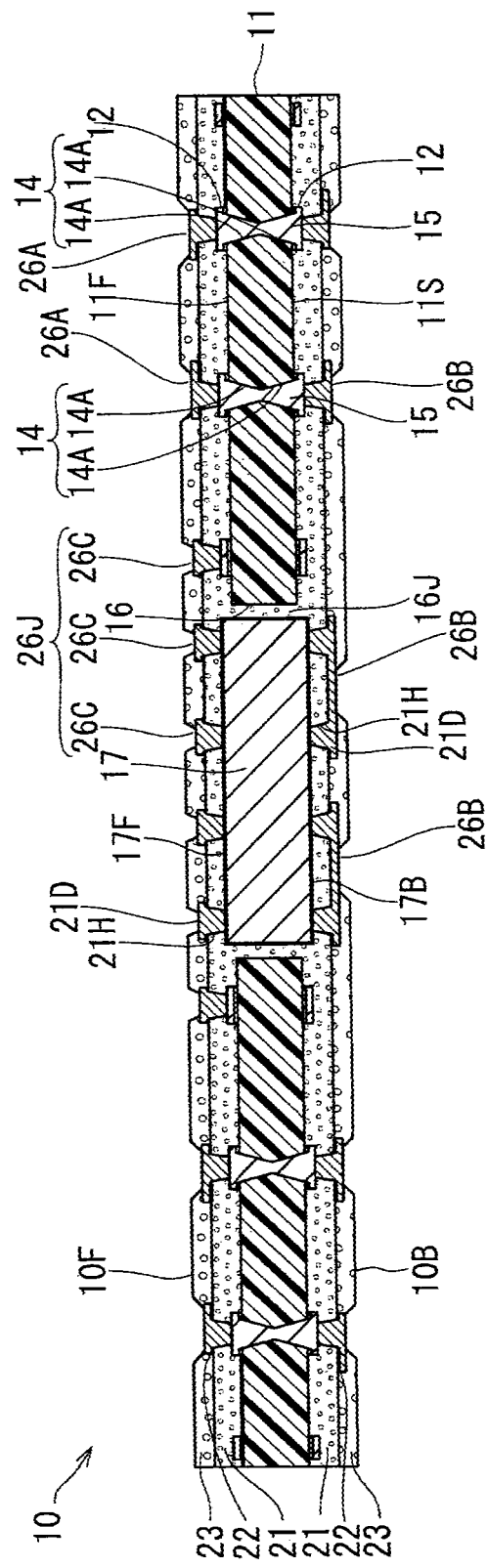
FIG. 10 is a cross-sectional side view illustrating a manufacturing process of the circuit substrate.

(21) As illustrated in FIG. 10, tapered pad holes are formed at predetermined places in the solder resist layers (23, 23) on the front and back sides of the core substrate 11, and portions of the conductor layers 22 on the front and back sides of the core substrate 11 that are exposed from the pad holes become the pads 26.

(22) On each of the pads 26, a nickel layer, a palladium layer and a gold layer are laminated in this order and a metal film 41 illustrated in FIG. 3 is formed. As a result, the circuit substrate 10 is completed. A tin layer may be formed as the metal film 41. Further, instead of the metal film 41, it is also possible to perform a surface treatment using OSP (preflux).

Figure 11:
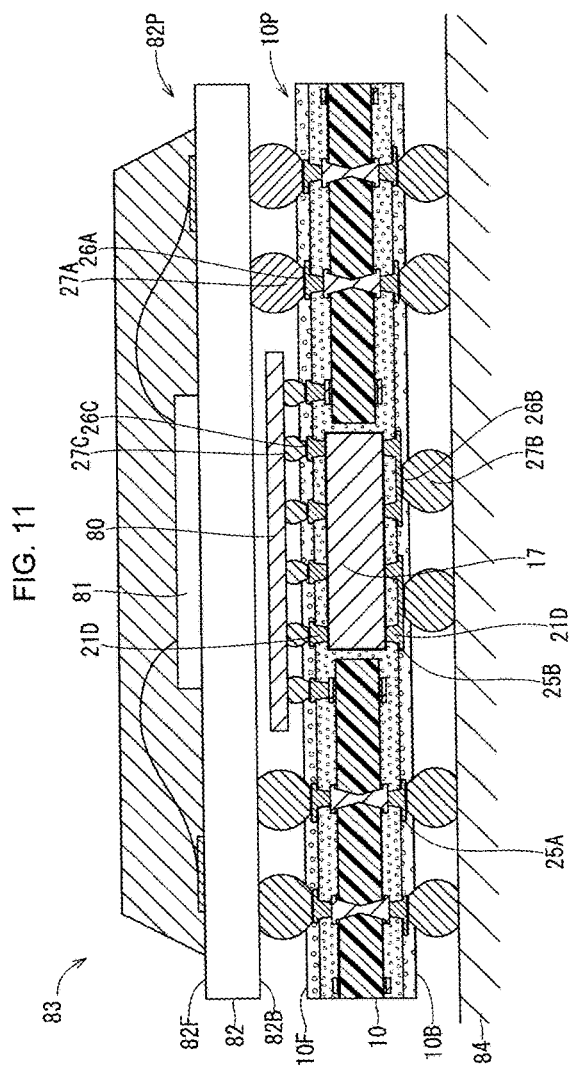
FIG. 11 is a cross-sectional side view of a PoP that includes the circuit substrate.

The description about the structure and the manufacturing method of the circuit substrate 10 of the present embodiment is as given above. Next, an operation effect of the circuit substrate 10 is described together with an example of use of the circuit substrate 10. The circuit substrate 10 of the present embodiment is used, for example, as follows. That is, as illustrated in FIG. 11, large, medium and small solder bumps (27B, 27A, 27C) (referred to as "solder bumps 27" when they are referred to without distinction) that respectively match the sizes of the above-described large, medium and small pads (26B, 26A, 26C) of the circuit substrate 10 are respectively formed on the large, medium and small pads (26B, 26A, 26C). Then, for example, a CPU 80 having on a lower surface a group of pads that are similarly formed as the group of the small pads on the F surface (10F) of the circuit substrate 10 is mounted on and soldered to the group of the small solder bumps (27C) of each product region (R2), and a first package substrate (10P) is formed. In this case, for example, four pads for grounding that the CPU 80 has are connected via four via conductors (21D) to the metal block 17 of the circuit substrate 10.

Next, a second package substrate (82P) that is obtained by mounting a memory 81 on an F surface (82F) of a circuit substrate 82 is positioned from an upper side of the CPU 80 on the first package substrate (10P). The medium solder bumps (27A) of the circuit substrate 10 of the first package substrate (10P) are soldered to pads that are provided on a B surface (82B) of the circuit substrate 82 of the second package substrate (82P). Thereby, a PoP 83 (Package on Package 83) is formed. Spacing between the circuit substrates 10, 82 in the PoP 83 is filled with a resin (not illustrated in the drawings).

Next, the PoP 83 is positioned on a motherboard 84. The large solder bumps (27B) on the circuit substrate 10 of the PoP 83 are soldered to a group of pads of the motherboard 84. In this case, for example, two pads for grounding that the motherboard 84 has are soldered to two pads 26 of the circuit substrate 10 that are connected to the metal block 17 via four via conductors (21D). When the CPU 80 and the motherboard 84 have pads dedicated to heat dissipation, the pads dedicated to heat dissipation and the metal block 17 of the circuit substrate 10 may be connected to each other via the via conductors (21D).

When the CPU 80 generates heat, the heat is transmitted to the metal block 17 via the via conductors (21D) on the F surface (10F) side of the circuit substrate 10 on which the CPU 80 is mounted, and is dissipated from the metal block 17 to the motherboard 84 via the via conductors (21D) on the B surface (10B) side of the circuit substrate 10.

Next, an effect of the circuit substrate 10 of the present embodiment is described. When all of the via conductors (21D) are independently connected to the individual lands (25A), depending on a positional relation between adjacent via conductors (21D), positions of the pads 26 on the lands 25 are likely to be limited. In contrast, in the circuit substrate 10 of the present embodiment, multiple via conductors (21D) are connected in parallel and a common land (25B) of a size that allows base end portions of the via conductors (21D) to be accommodated therein is provided. Therefore, the positional relation between adjacent via conductors (21D) is less likely to be restricted, and a degree of freedom of the positions of the pads 26 that are formed on the lands 25 is improved. Further, a degree of freedom in the number of the pads 26 that are formed on the lands 25 is also improved, such as that, for example, two via conductors (21D) are formed on one of front and back surfaces of the common land (25B) and one pad 26 is formed on the other surface of the common land (25B). That is, according to the structure of the present embodiment, a degree of freedom of the formation of the pads 26 on the lands 25 can be improved.

Here, due to a specification change, when a type of the motherboard 84 to which the circuit substrate 10 is connected is changed, depending on positions of pads of the motherboard 84, it may be likely to become necessary to also change the formation of the via conductors (21D) in the circuit substrate 10 in order to change the positions of the pads 26 of the circuit substrate 10. In contrast, in the circuit substrate 10 of the present embodiment, the common land (25B) is provided to which the via conductors (21D) are connected in parallel. Therefore, it is possible that, without changing the formation of the via conductors (21D) that are connected to the common land (25B), only the positions of the pads 26 are changed. That is, a specification change can be dealt with by making only a design change outside the common land (25B), and a change of the formation and the like of the via conductors can be reduced.

In general, in a circuit substrate 10 of this type, there are fewer pads 26 on the motherboard 84 side (substrate connecting part side) than on the CPU 80 side (electronic component mounting part (26J) side) when compared for the same area, and the pads 26 on the motherboard 84 side (substrate connecting part side) are larger than the pads 26 on the CPU 80 side (electronic component mounting part (26J) side). In contrast, in the circuit substrate 10 of the present embodiment, since the common lands (25B) are provided, large pads 26 can be easily formed.

Further, in order to increase the sizes of the pads 26, it may be also necessary to increase the sizes of the lands 25. Therefore, in a case of a structure in which the via conductors (21D) and the pads 26 sandwiching the lands 25 are in one-to-one correspondence, it is likely to be difficult to equalize the numbers of the via conductors (21D) that are connected to the front and back surfaces of the metal block 17. However, according to the present embodiment, the number of the via conductors (21D) that are connected to the common lands (25B) can be larger than the number of the pads 26 on the common lands (25B). Therefore, the numbers of the via conductors (21D) that are connected to the front and back surfaces of the metal block 17 can be easily equalized.

Further, the circuit substrate 10 repeats thermal expansion and contraction due to use and non-use of the CPU 80. Then, due to a difference in thermal expansion coefficient between the metal block 17 and the insulating resin layer 21 of the build-up layer 20, a shear force acts between the metal block 17 and the insulating resin layer 21 of the build-up layer 20, and there is a concern that the via conductors (21D) together with the insulating resin layer 21 may peel off from the metal block 17. However, in the circuit substrate 10 of the present embodiment, both the front and back surfaces (the first primary surface (17F) and the second primary surface (17B)) of the metal block 17 that are covered by the insulating resin layers (21, 21) are formed as rough surfaces. Therefore, peeling between the metal block 17 and the insulating resin layers (21, 21) can be suppressed, and the fixation of the metal block 17 in the circuit substrate 10 can be stabilized. Further, by roughening the surfaces of the metal block 17, a contact area between the metal block 17 and the insulating resin layers (21, 21) and the filling resin (16J) in the cavity 16 is increased, and efficiency of heat dissipation from the metal block 17 to the circuit substrate 10 is increased.

Second Embodiment

Figure 12:
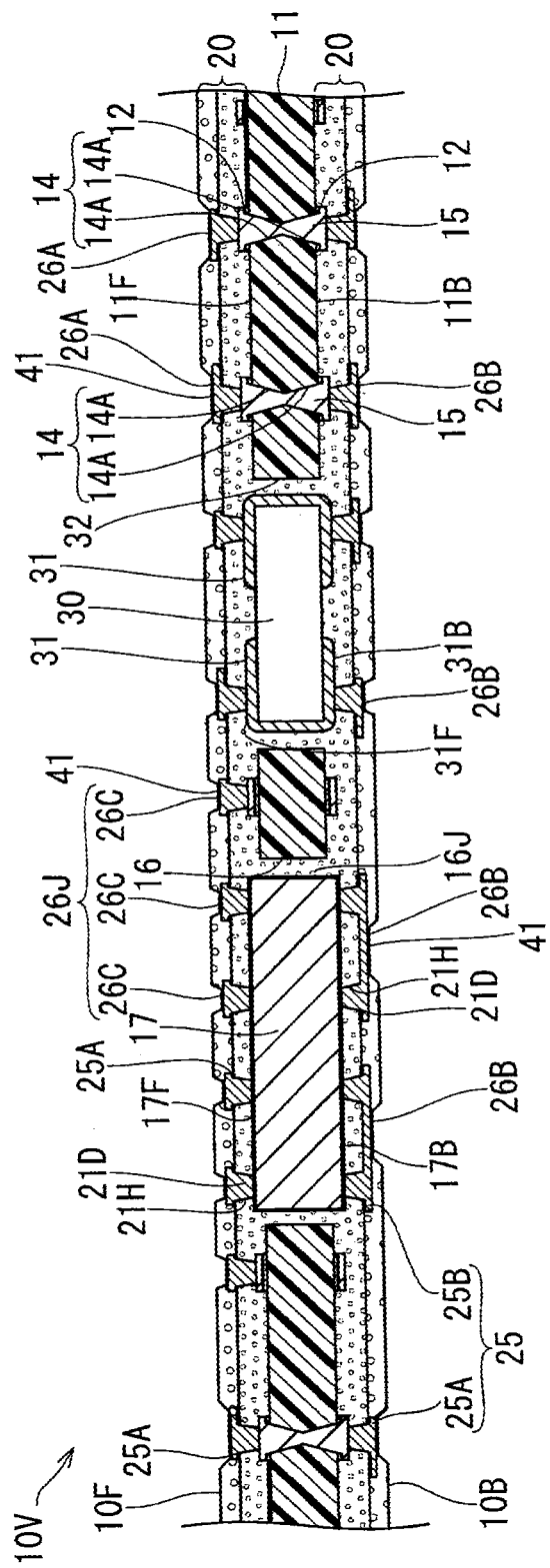
FIG. 12 is a cross-sectional side view of a circuit substrate of a second embodiment.

A circuit substrate (10V) of the present embodiment is illustrated in FIG. 12. In the circuit substrate (10V), cavities 32 that each accommodate a multilayer ceramic capacitor 30 are provided near the cavity 16 that accommodates the metal block 17. The multilayer ceramic capacitor 30 has a structure in which, for example, two end portions of a ceramic prismatic body are covered by a pair of electrodes (31, 31). Further, similar to the metal block 17, each multilayer ceramic capacitor 30 slightly protrudes from the F surface (11F) and the B surface (11B) of the core substrate 11. A first flat surface (31F) of each of the electrodes 31 of the multilayer ceramic capacitor 30 is flush with the outermost surface of the conductor circuit layer 12 on the F surface (11F) side of the core substrate 11, and a second flat surface (31B) of each of the electrodes 31 of the multilayer ceramic capacitor 30 is flush with the outermost surface of the conductor circuit layer 12 on the B surface (11B) side of the core substrate 11. The multilayer ceramic capacitor 30 is positioned below the electronic component mounting part (26J). The via conductors (21D) contained in the build-up layers (20, 20) on both the front and back surfaces of the core substrate 11 are connected to the electrodes 31 of the multilayer ceramic capacitors 30. Further, when the circuit substrate (10V) is manufactured, the metal block 17 and the multilayer ceramic capacitors 30 are respectively accommodated in the cavities (16, 32) in the same process. Here, a diameter (top diameter) of via conductors (21D) that connect the electrodes 31 of the multilayer ceramic capacitor 30 and the first conductor layer 22, a diameter (top diameter) of via conductors (21D) that connect the conductor circuit layer 12 and the first conductor layer 22 and a diameter (top diameter) of via conductors (21D) that connect the metal block 17 and the first conductor layer 22 may be substantially the same or may be different.

Other Embodiments

The present invention is not limited to the above-described embodiments. For example, embodiments described below are also included in the technical scope of the present invention. Further, in addition to the embodiments described below, the present invention can also be embodied in various modified forms within the scope without departing from the spirit of the present invention.

(1) In the above-described embodiments, the pads 26 are provided on all of the lands 25 that connect to the via conductors (21D). However, a land 25 on which a pad 26 is not provided may also exist.

(2) In the circuit substrates (10, 10V) of the above-described embodiments, the numbers of the via conductors (21D) that are connected to the metal block 17 are the same in the build-up layer 20 on the F surface (11F) side of the core substrate 11 and in the build-up layer 20 on the B surface (11B) side of the core substrate 11. However, it is also possible that the number of the via conductors (21D) in the build-up layer 20 on one side is larger than the number of the via conductors (21D) in the build-up layer 20 on the other side.

(3) The front and back surfaces of the metal block 17 in the above-described embodiments are roughened before the copper plate 50 is cut. However, it is also possible that the roughening is performed after the cutting. In this case, all the surfaces of the metal block 17 are in a state of being roughened.

(4) In the above-described embodiments, the electronic components that are accommodated in the cavities 32 are the multilayer ceramic capacitors 30. However, other than the multilayer ceramic capacitors 30, other electronic components, for example, passive components such as capacitors, resistors, thermistors and coils, and active components such as IC circuits, and the like, may also be accommodated in the cavities 32.

Figure 13:
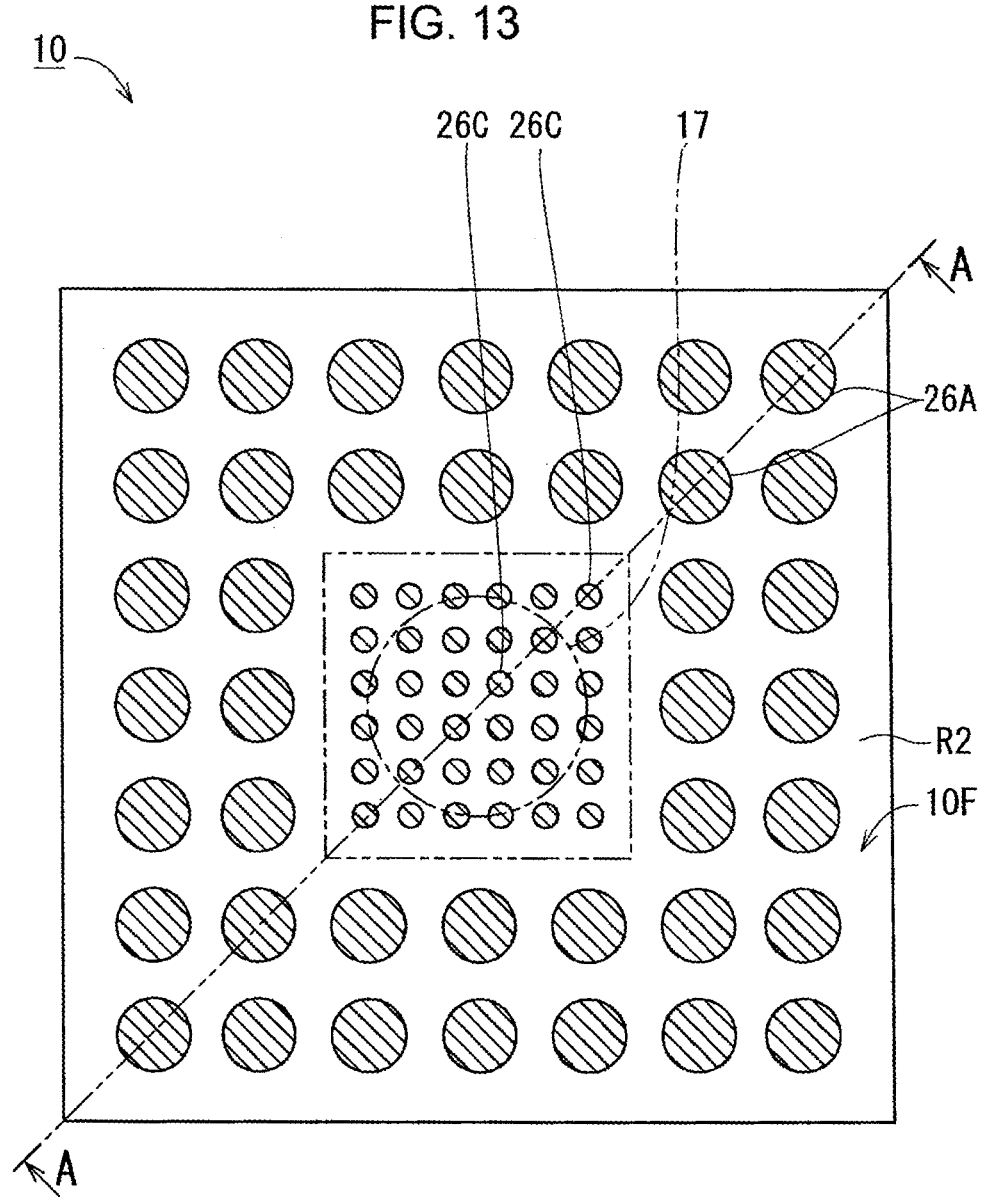
FIG. 13 is a plan view of a product region in a circuit substrate according to a modified embodiment.

(5) The planar shape of the metal block 17 in the above-described embodiments is rectangular. However, the planar shape of the metal block 17 may also be other polygonal shapes, and may also be circular as illustrated in FIG. 13, and may also be elliptical or oval.

(6) The metal block 17 in the above-described embodiments is made of copper. However, the present invention is not limited to this. For example, the metal block 17 may also be made of a mixture of copper and molybdenum or tungsten, or made of aluminum or the like.

(7) In the above-described embodiments, the distance between the first primary surface (17F) and the second primary surface (17B) of the metal block 17 is larger than the plate thickness of the core substrate 11. However, it is also possible that the distance between the first primary surface (17F) and the second primary surface (17B) of the metal block 17 is the same as the plate thickness of the core substrate 11 or is smaller than the plate thickness of the core substrate 11.

Figure 14:
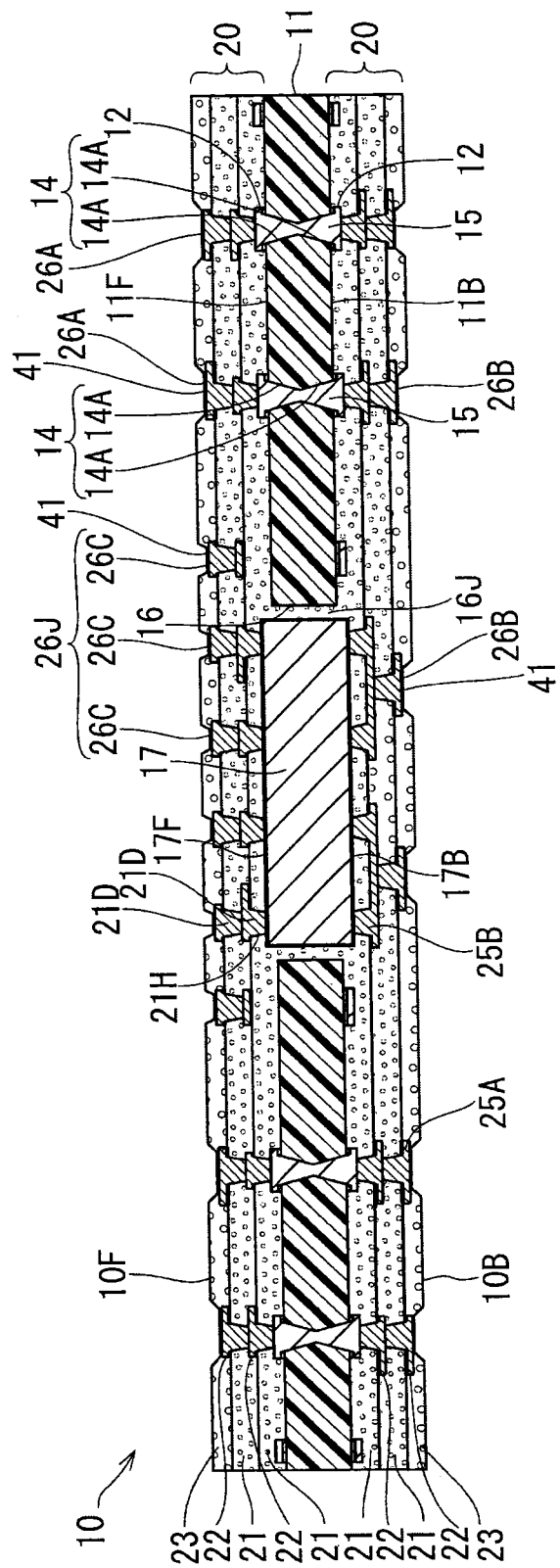
FIG. 14 is a cross-sectional side view of a circuit substrate according to a modified embodiment.

(8) In the above-described embodiments, in each of the build-up layers 20 on the front and back sides of the core substrate 11, one insulating resin layer 21 and one conductor layer 22 are formed. However, as illustrated in FIG. 14, it is also possible that two insulating resin layers and two conductor layers are formed, or three or more insulating resin layers and three or more conductor layers are formed.

formed In this case, a portion, to which a via conductor (21D) on a land 25 provided in a conductor layer 22 other an outermost conductor layer 22 is connected, also corresponds to a "pad" according to an embodiment of the present invention.

Figure 15:
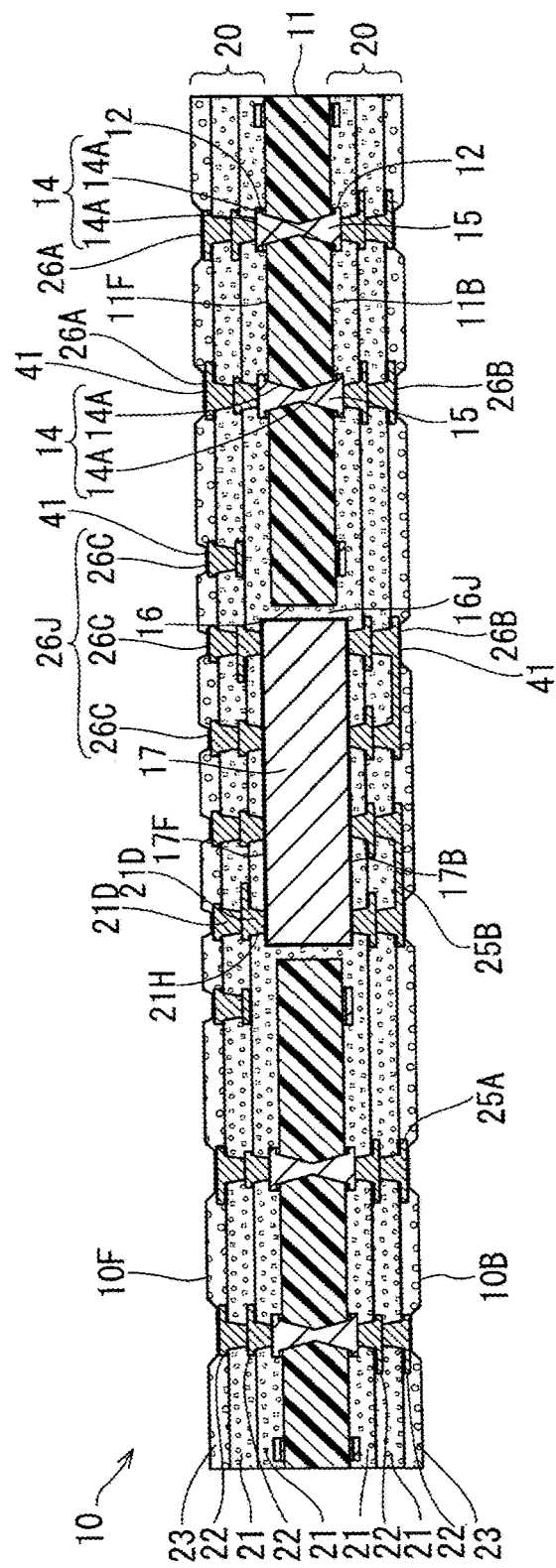
FIG. 15 is a cross-sectional side view of a circuit substrate according to a modified embodiment.

(9) In the case where insulating resin layers 21 and conductor layers 22 are laminated in each of the build-up layers 20 on the front and back sides of the core substrate 11, as illustrated in FIG. 15, it is also possible that a common land (25B) is provided in a conductor layer 22 other than a conductor layer 22 that is closest to the metal block 17.

Figure 16:
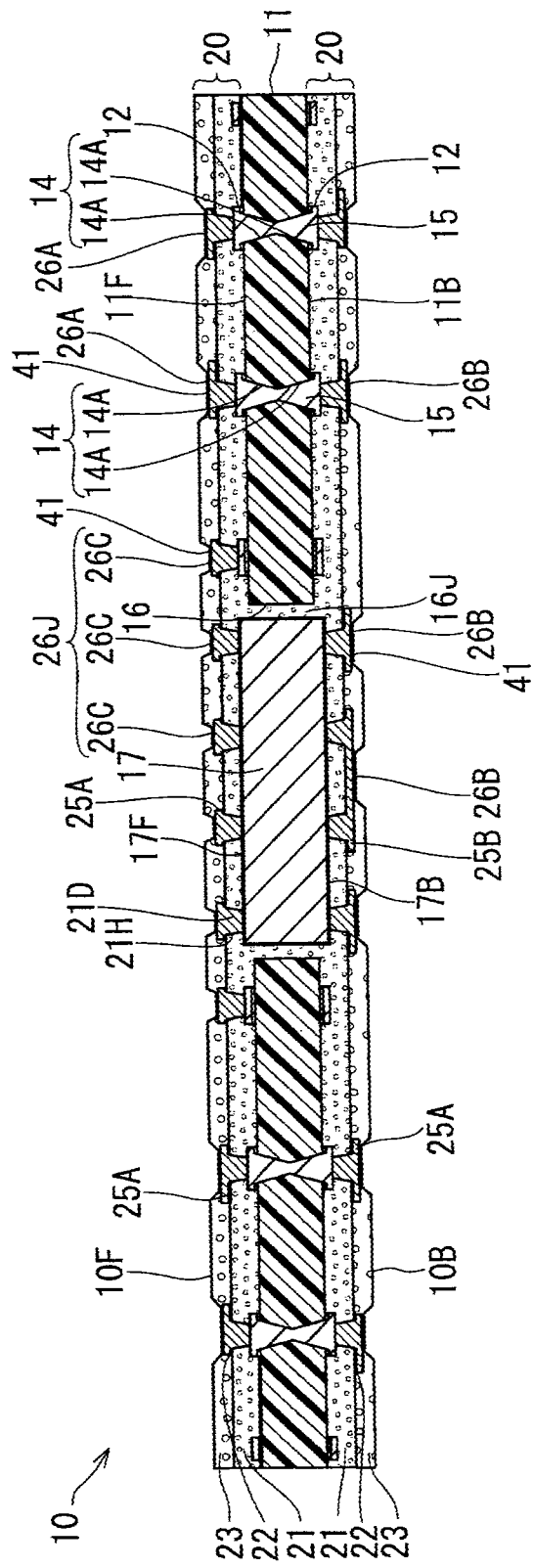
FIG. 16 is a cross-sectional side view of a circuit substrate according to a modified embodiment.

(10) In the above-described embodiments, all of the via conductors (21D) that are connected to the second primary surface (17B) of the metal block 17 are connected to the common lands (25B). However, as illustrated in FIG. 16, it is also possible to adopt a structure in which some of the via conductors (21D) are connected to common lands (25B) and the other via conductors (21D) are connected to individual lands (25A).

(11) In the above-described embodiments, the number of the pads 26 formed in the common land (25B) is less than the number of the via conductors (21D) positioned on the common land (25B). However, the number of the pads 26 formed in the common land (25B) may greater than or equal to the number of the via conductors (21D) positioned on the common land (25B).

(12) In the above-described embodiments, the common land (25B) is provided only in the build-up layer 20 on the B surface (11B) side of the core substrate 11. However, it is also possible that the common land (25B) is provided only in the build-up layer 20 on the F surface (11F) side of the core substrate 11 or in both of the build-up layers 20.

Figure 17:
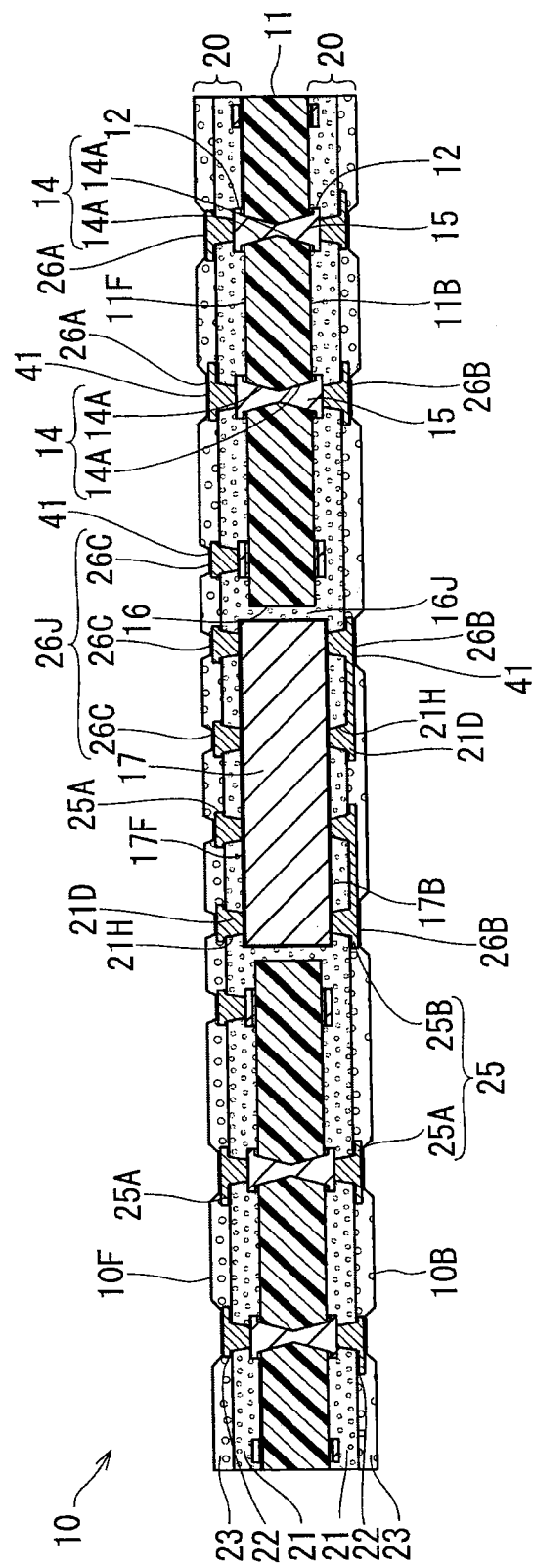
FIG. 17 is a cross-sectional side view of a circuit substrate according to a modified embodiment.

(13) In the above-described embodiments, the large pad (26B) on the common land (25B) is formed at a middle position between the two via conductors (21D) that are connected to the common land (25B). However, it is also possible that the large pad (26B) is formed on an outer side of the two via conductors (21D) or, as illustrated in FIG. 17, is formed on an axis of one of the via conductors (21D).

Figure 18:
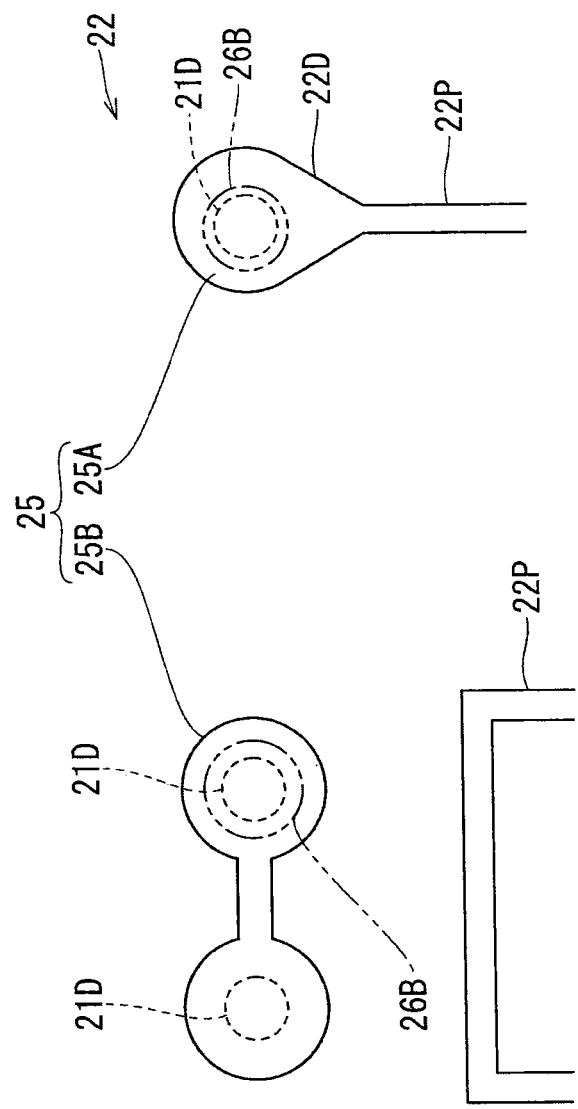
FIG. 18 is a plan cross-sectional view of a circuit substrate according to a modified embodiment.

(14) In the above-described embodiments, the common land (25B) has an oval shape. However, the present invention is not limited to this. For example, as illustrated in FIG. 18, the shape of the common land (25B) may also be a so-called "dumbbell shape," a shape in which two circles are connected by a rectangle.

Figure 19:
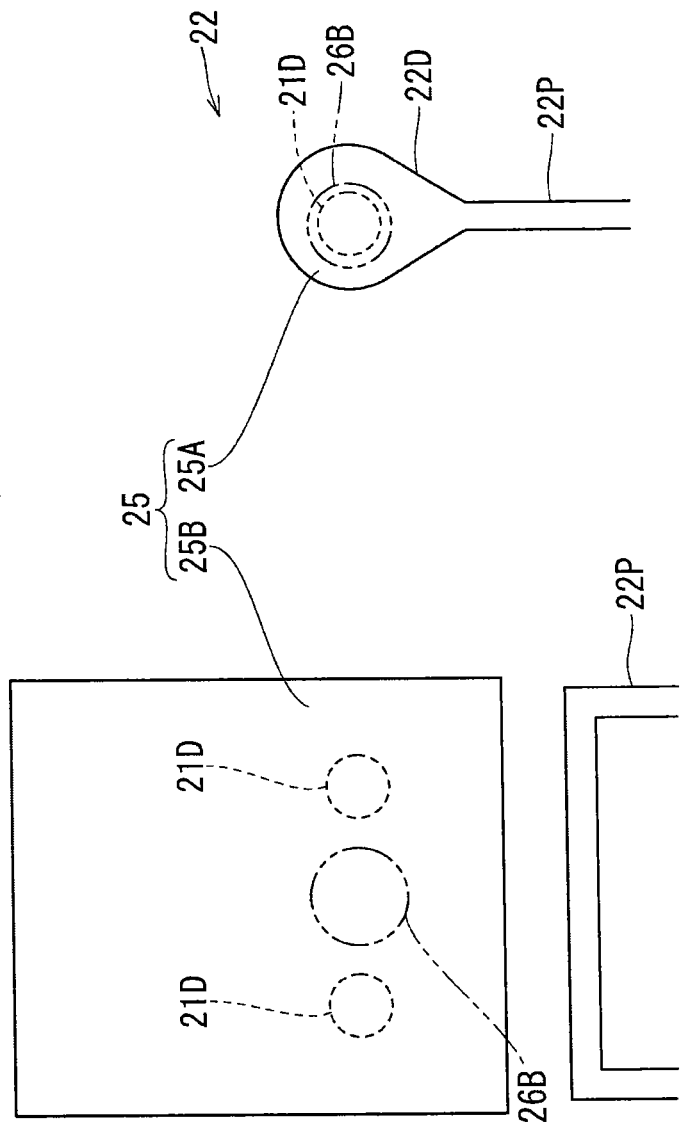
FIG. 19 is a plan cross-sectional view of a circuit substrate according to a modified embodiment.

(15) As illustrated in FIG. 19, it is also possible to adopt a structure in which the common land (25B) is a solid conductor.

There are various differences in sizes of and in spacings between connecting parts of an external component, such as a motherboard or an element, to be connected, the connecting parts connecting to the circuit substrate. Therefore, it is likely that, due to a specification change, it may be necessary to significantly change formation of the via conductors in the circuit substrate.

A circuit substrate according to an embodiment of the present invention reduces formation change of via conductors resulting from a specification change.

A circuit substrate according to one aspect of the present invention includes: a core substrate that has a cavity that accommodates a metal block; and build-up layers that are respectively laminated on front and back sides of the core substrate and respectively include insulating resin layers that respectively cover front and back sides of the cavity and the metal block. At least one of the build-up layers on the front and back sides of the core substrate includes via conductors connected to the metal block, and a common land connecting the via conductors in parallel.

Obviously, numerous modifications and variations of the present invention are possible in light of the above teachings. It is therefore to be understood that within the scope of the appended claims, the invention may be practiced otherwise than as specifically described herein.

What is claimed is:

1. A circuit substrate, comprising:
   a core substrate having a cavity;
   a metal block accommodated in the cavity of the core substrate;
   a first build-up layer comprising a conductor circuit layer and an insulating resin layer and laminated on a first surface of the core substrate such that the conductor circuit layer is formed on the first surface of the core substrate and the insulating resin layer is covering the conductor circuit layer and a first surface of the metal block in the cavity; and
   a second build-up layer comprising a conductor circuit layer and an insulating resin layer and laminated on a second surface of the core substrate such that the conductor circuit layer is formed on the second surface of the core substrate and the insulating resin layer is covering the conductor circuit layer and a second surface of the metal block in the cavity,
   wherein the second build-up layer comprises a plurality of first via conductors connected to the second surface of the metal block through the insulating resin layer in the second build-up layer, a plurality of common lands connecting the first via conductors in parallel, and a plurality of second via conductors connected to the conductor circuit layer on the second surface of the core substrate through insulating resin layer in the second build-up layer, and the plurality of common lands has a plurality of pad portions formed such that the plurality of pad portions is positioned to mount a plurality of solder bumps for a second circuit substrate.

2. A circuit substrate according to claim 1, wherein the core substrate comprises a resin and a reinforcing material, and the plurality of common lands has the plurality of pad portions formed such that each of the pad portions is positioned between two first via conductors connected on an opposite side by a respective one of the common lands.

3. A circuit substrate according to claim 2, wherein the second build-up layer is formed such that a number of the common lands is less than a number of the first via conductors.

4. A circuit substrate according to claim 3, wherein the first build-up layer comprises an electronic component mounting structure formed on a surface of the first build-up layer such that the electronic component mounting structure mounts an electronic component on the surface of the first build-up layer, and the second build-up layer comprises a substrate mounting structure formed on a surface of the second build-up layer such that the substrate mounting structure mounts the second circuit substrate on the surface of the second build-up layer.

5. A circuit substrate according to claim 4, wherein the first and second build-up layers are formed such that the first and second build-up layers have a same number of first via conductors connected to the first surface of the metal block in the first build-up layer and the second surface of the metal block in the second build-up layer.

6. A circuit substrate according to claim 2, wherein the first build-up layer comprises an electronic component mounting structure formed on a surface of the first build-up layer such that the electronic component mounting structure mounts an electronic component on the surface of the first build-up layer, and the second build-up layer comprises a substrate mounting structure formed on a surface of the second build-up layer such that the substrate mounting structure mounts the second circuit substrate on the surface of the second build-up layer.

7. A circuit substrate according to claim 6, wherein the first and second build-up layers are formed such that the first and second build-up layers have a same number of first via conductors connected to a first surface of the metal block in the first build-up layer and the second surface of the metal block in the second build-up layer.

8. A circuit substrate according to claim 2, wherein the first and second build-up layers are formed such that the first and second build-up layers have a same number of first via conductors connected to a first surface of the metal block in the first build-up layer and the second surface of the metal block in the second build-up layer.

9. A circuit substrate according to claim 1, wherein the second build-up layer is formed such that a number of the common lands is less than a number of the first via conductors.

10. A circuit substrate according to claim 9, wherein the first build-up layer comprises an electronic component mounting structure formed on a surface of the first build-up layer such that the electronic component mounting structure mounts an electronic component on the surface of the first build-up layer, and the second build-up layer comprises a substrate mounting structure formed on a surface of the second build-up layer such that the substrate mounting structure mounts the second circuit substrate on the surface of the second build-up layer.

11. A circuit substrate according to claim 9, wherein the first and second build-up layers are formed such that the first and second build-up layers have a same number of first via conductors connected to surfaces of the metal block.

12. A circuit substrate according to claim 1, wherein the first build-up layer comprises an electronic component mounting structure formed on a surface of the first build-up layer such that the electronic component mounting structure mounts an electronic component on the surface of the first build-up layer, and the second build-up layer comprises a substrate mounting structure formed on a surface of the second build-up layer such that the substrate mounting structure mounts the second circuit substrate on the surface of the second build-up layer.

13. A circuit substrate according to claim 12, wherein the first and second build-up layers are formed such that the first and second build-up layers have a same number of first via conductors connected to the first surface of the metal block in the first build-up layer and the second surface of the metal block in the second build-up layer.

14. A circuit substrate according to claim 1, wherein the first and second build-up layers are formed such that the first and second build-up layers have a same number of first via conductors connected to the first surface of the metal block in the first build-up layer and the second surface of the metal block in the second build-up layer.

15. A circuit substrate according to claim 1, wherein the first build-up layer comprises an electronic component mounting structure formed on a surface of the first build-up layer such that the electronic component mounting structure comprises a plurality of pads positioned to mount an electronic component on the surface of the first build-up layer, and the second build-up layer comprises a substrate mounting structure formed on a surface of the second build-up layer such that the substrate mounting structure comprises the plurality of pads positioned to mount the second circuit substrate on the surface of the second build-up layer.

16. A method for manufacturing a circuit substrate, comprising:
    forming a cavity in a core substrate;
    accommodating a metal block in the cavity of the core substrate;
    forming on a first surface of the core substrate a first build-up layer comprising a conductor circuit layer and an insulating resin layer such that the conductor circuit layer is formed on the first surface of the core substrate and the insulating resin layer covers the conductor circuit layer and a first surface of the metal block in the cavity; and
    forming on a second surface of the core substrate a second build-up layer comprising a conductor circuit layer and an insulating resin layer such that the conductor circuit layer is formed on the second surface of the core substrate and the insulating resin layer covers the conductor circuit layer and a second surface of the metal block in the cavity,
    wherein the forming of the second build-up layer comprises forming a plurality of first via conductors connected to the second surface of the metal block through the insulating resin layer in the second build-up layer, a plurality of common lands connecting the first via conductors in parallel, and a plurality of second via conductors connected to the conductor circuit layer on the second surface of the core substrate through insulating resin layer in the second build-up layer, and the forming of the second build-up layer comprises forming the plurality of common lands having a plurality of pad portions such that the plurality of pad portions is positioned to mount a plurality of solder bumps for a second circuit substrate.

17. A method for manufacturing a circuit substrate according to claim 16, wherein the forming of the second build-up layer comprises forming the plurality of common lands having the plurality of pad portions such that each of the pad portions is positioned between two first via conductors connected by a respective one of the common lands.

18. A method for manufacturing a circuit substrate according to claim 16, wherein the forming of the second build-up layer comprises forming the second build-up layer such that a number of the common lands is less than a number of the first via conductors.

19. A method for manufacturing a circuit substrate according to claim 16, wherein the forming of the first build-up layer comprises forming an electronic component mounting structure on a surface of the first build-up layer such that the electronic component mounting structure mounts an electronic component on the surface of the first build-up layer, and the forming of the second build-up layer comprises forming a substrate mounting structure on a surface of the second build-up layer such that the substrate mounting structure mounts the second circuit substrate on the surface of the second build-up layer.

20. A method for manufacturing a circuit substrate according to claim 16, wherein the first and second build-up layers are formed such that the first and second build-up layers have a same number of first via conductors connected to a first surface of the metal block in the first build-up layer and the second surface of the metal block in the second build-up layer.

* * * * *